US005550008A

United States Patent [19]
Tomo et al.

[11] Patent Number: 5,550,008
[45] Date of Patent: Aug. 27, 1996

[54] METHOD FOR MAKING A DRY ETCHING RESISTANT POSITIVE AND NEGATIVE PHOTORESIST

[75] Inventors: Yoichi Tomo; Masao Saito, both of Kanagawa, Japan

[73] Assignee: Sony Corporation, Tokyo, Japan

[21] Appl. No.: 438,832

[22] Filed: May 11, 1995

Related U.S. Application Data

[62] Division of Ser. No. 250,530, May 31, 1994, Pat. No. 5,474,872.

[30] Foreign Application Priority Data

May 31, 1993 [JP] Japan .................................. 5-153044
Jan. 10, 1994 [JP] Japan .................................. 6-000971

[51] Int. Cl.$^6$ ............................................. G03C 5/00
[52] U.S. Cl. ........................ 430/325; 430/326; 430/330
[58] Field of Search ................................. 430/325, 326, 430/330

[56] References Cited

U.S. PATENT DOCUMENTS 4,491,628  1/1985  Ito et al. ........................... 430/325 X

FOREIGN PATENT DOCUMENTS 0333407  9/1989  European Pat. Off. ............... 430/330
0487261  5/1992  European Pat. Off. ............... 430/330

Primary Examiner—George F. Lesmes
Assistant Examiner—Bernard P. Codd
Attorney, Agent, or Firm—Hill, Steadman & Simpson

[57] ABSTRACT

A new photoresist composition suited for fine processing is provided which has practical applications in various dry etching processes. An advantageous pattern formation method using such a photoresist composition is also provided. The photoresist composition (1) includes a substance containing a skeleton as at least a part of the main chain. The skeleton is obtained through polymerization of a vinyl alcohol-type compound such as a polyvinyl alcohol chain, at least some hydroxyl groups in the skeleton being protected by protective groups capable of being released by an acid. The skeleton preferably contains a group for improving the dry etching resistance. The photoresistive composition also includes an optical acid generator. Development with a high polarity solvent, for instance aqueous development, is provided. A positive pattern is obtained by aqueous development and a negative pattern is obtained by alcohol development.

5 Claims, 1 Drawing Sheet

METHOD FOR MAKING A DRY ETCHING RESISTANT POSITIVE AND NEGATIVE PHOTORESIST

This is a division, of application Ser. No. 08/250,530, filed May 31, 1994, now U.S. Pat. No. 5,474,872, issued Dec. 12, 1995.

BACKGROUND OF THE INVENTION

1. Field of the Invention

This invention relates to a photoresistive composition and also to a method of forming a pattern using such a composition. More particularly, the invention provides a new photosensitive composition and also a method of forming a pattern using such a photoresistive composition. The photoresistive composition and the pattern formation method according to the invention can be utilized for forming various patterns in the field of fabrication of electronic materials (such as semiconductor devices).

2. Description of the Related Art

Up to date, there is a trend for finer and denser electronic materials, such as semiconductor devices. For example, the minimum width of semiconductor integrated circuit lines is now going from the order of sub-half micron to the order of quarter micron. To cope with this trend, the lithographic technology, in which the exposure light is short wavelength light of KrF eximer laser (248 nm), ArF eximer laser (193 nm), etc., is attracting attention. Heretofore, various types of photoresists have been proposed for use with such laser beams. For example, chemical amplification type photoresists are attracting attention. A typical chemical amplification photoresist, for instance of positive type, comprises a resin, a dissolution inhibition material and a photo acid generator (i.e., a photo-sensor). In the non-exposed area the dissolution inhibition material is not dissolved in aqueous alkaline solution (i.e., developer) for protecting the resin. But in the exposed area, acid is generated from the photo acid generator, and the dissolution inhibition material is released by this acid to become soluble in the aqueous alkaline solution. The acid acts as a catalyst and hence is not substantially consumed while progressively releasing the dissolution inhibition material. Thus, the photoresist is called chemical applification type.

At present, however, the various photoresists such as those of the chemical amplification type are actually seldom utilized in various high resolution dry etching processes. (For recent techniques of this kind, see Nozaki et al, 1992 Autumn Proceedings of the Japan Society of Applied Physics, page 504, 17p-ZM-8, and Endo et al "Technical Digest of IEDM", 1992, page 46.)

OBJECTS AND SUMMARY OF THE INVENTION

A first object of the invention is to provide a new photoresist composition, which is suited for fine processes and can be actually utilized for various dry etching processes.

A second object of the invention is to provide an advantageous pattern formation method using such a photoresist composition.

To attain the above objects of the invention, there is provided a photoresist composition, which comprises a substance containing a skeleton as at least a part of a main chain, the skeleton being obtained through polymerization of a vinyl alcohol type compound, at least some hydroxyl groups in the skeleton being protected by acid-releasing protective group, and a photo acid generator. By the term "vinyl alcohol type compound" is meant a compound which gives a polyvinyl alcohol chain (with or without a substitute group).

To attain the objects of the invention, there is also provided a photoresist composition as noted above, in which the substance containing a skeleton as at least a part of a main chain, the skeleton being obtained through polymerization of a vinyl alcohol type compound, at least some hydroxyl groups in the skeleton being protected by acid-releasing protective group, is represented by the following Formula (1).

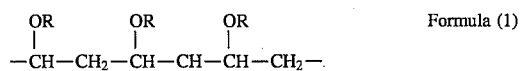

where R is a substitute group, at least some of the substitute groups R being protective groups $R^0$ capable of being released by acid.

To attain the objects of the invention, there is further provided a photoresist composition as noted above, in which the substance containing a skeleton as at least a part of a main chain, the skeleton being obtained through polymerization of a vinyl alcohol type compound, at least some hydroxyl groups in the skeleton being protected by acid-releasing protective groups, is represented by the following Formula (2).

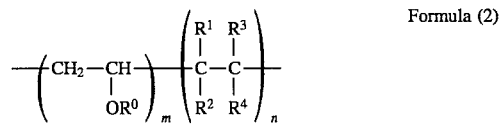

where $R^0$ is a protective group capable of being released with acid, and $R^1$ to $R^4$ are substitute groups, m:n being 1:9 to 7:3.

To attain the objects of the invention, there is still further provided a photo-sensitive composition as noted above, in which the substance containing a skeleton as at least a part of a main chain, the skeleton being obtained through polymerization of a vinyl alcohol type compound, at least some hydroxyl groups in the skeleton being protected by acid-releasing protective groups, is represented by the following Formula (3).

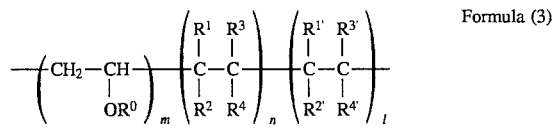

where $R^0$ is a protective group capable of being released by acid, $R^1$ to $R^4$ and $R^{1'}$ to $R^{4'}$ are substitute groups, m: (n+1) being 1:9 to 7:3.

To attain the objects of the invention, there is yet further provided a method of forming a pattern on an exposure material by using either of the above photosensitive composition, development being done with a high polarity solution. As the high polarity solution, water or aqueous solution mainly composed of water may be used when obtaining a positive pattern, and various alcohols, typically ethanol, may be used to obtain a negative pattern. It is further possible to obtain a negative pattern with ketones (e.g., acetone). While water or like aqueous solution is used to obtain a positive pattern, it is desirable to make development with hot water at 50° C. or above for realizing satisfactory development.

To attain the objects of the invention, there is further provided a method of forming a pattern as noted above, in which rinsing is done with a low polarity solvent. As the low polarity solvent may be used various organic solvents which do not dissolve the pattern.

Examples of the protective group $R^0$ capable of being released by acid as noted above are class 2nd and 3rd alcohol carboxylate represented as

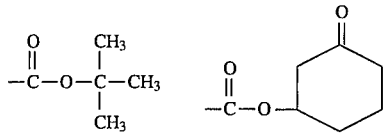

substitute groups containing ether bond, such as ethylvinyl ether represented as

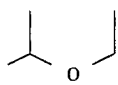

and tetrahydropyranyl ether represented as

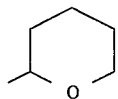

and Ac acetate.

According to the invention, the substitute groups R other than $R^0$ are suitably those which can enhance the etching resistance. Examples of such group are the adamantyl group represented as

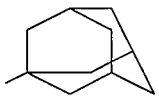

norbonyl group as

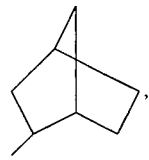

cyclohexyl group as

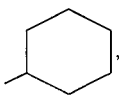

t-butyl group as

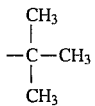

and cyclopentyl group as

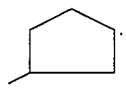

OH (hydroxyl group) and Ac (acetate group) may be present as residue.

Further, $R^0$ and other group R may be made integral to provide the following partial acetonide structure.

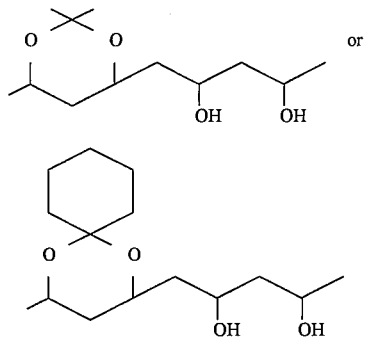

According to the invention, the skeleton of the composition may be made more chain-like and less subject to main chain breakage to increase the dry etching resistance. It is thus possible to obtain a photoresist composition, which can find suitable applications as resist materials exclusively used for ArF laser radiation or EB and X-rays.

The main skeleton of the composition according to the invention is obtained through polymerization of a vinyl alcohol type compound such as polyvinyl alcohol and those which are partially esterified (e.g., vinyl acetate). Protective groups for release protection with acid are introduced into a portion of the hydroxyl groups. Further, into a portion of the hydroxyl groups may suitably be introduced adamantyl or like substitute groups which impart with the dry etching resistance as noted above.

The groups that are to be substituted for are as exemplified above. Where the group to be substituted is an ether type protective group, the hydroxyl group is protected by using paratoluene sulfonic acid or like acid catalyst with methylene chloride as the solvent. Where the protective group is a carbonate, the corresponding chloride carbonate is reacted in ether or like solvent by using such basic catalyst as triethylamine, pyridine, etc. Thus, in the above cases the general order of introduction is to introduce first the ether type protective group and then the carbonate.

Where $R^0$ and other R are integral and thus providing a partial acetal structure (such as acetonide), reaction with the corresponding acetone and cyclohexane is brought about while azeotropically removing water with benzene or the like by using a Deanstalk type azeotropic apparatus. Further, this type of resin is commercially available as polybutyral resin.

Suitable examples of the protective group $R^0$ to be released with acid according to the invention are THP (tetrahydropyranile group), EE (ethylvinyl ether), t-BOC (t-butyl carbonate), etc.

Examples of $R^1$ to $R^4$ and $R^{1'}$ to $R^{4'}$ are hydrogen, halogen atoms (e.g., Cl), alkyl groups (including substituted alkyl groups, e.g., methyl group, ethyl group, —$CH_2Cl$, etc. ), allyl group (e.g., phenyl group ), —CO·OQ (Q representing methyl group, ethyl group, isopropyl group, butyl group, t-butyl group, cyclohexane group, etc. ), —COQ, —OAc, —CN, etc.

The following table shows examples of the combination of $R_1$ to $R_4$ to obtain photoresist compositions.

TABLE 1

| $R_1$ | $R_2$ | $R_3$ | $R_4$ | Material substance |
|---|---|---|---|---|
| 1 H | H | H | Cl | Vinyl chloride + vinyl alcohol copolymer (vinyl acetate) |
| 2 H | H | H | —CH₂—Cl | Allyl chloride + vinyl alcohol copolymer (vinyl acetate) |
| 3 H | H | H | —CO·OMe (Et, iPr, Bu, tBu, 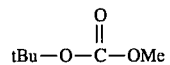) | Methyl acrylate + vinyl alcohol copolymer (vinyl acetate) |
| 4 H | H | CH₂ | —CO·PMe (Et, iPr, Bu, tBu, 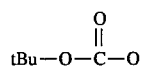) | Methyl acrylate + vinyl alcohol copolymer (vinyl acetate) |
| 5 H | H | H | —COQ | Alkylvinyl ketone + vinyl alcohol copolymer |
| 6 H | H | H | —Q (Me, Et) | Propylene |
| 7 H | H | H | —O-Ac | Partially saponified vinyl acetate |
| 8 H | H | H | —C≡N | Acrylonitrile + vinyl alcohol copolymer (vinyl acetate) |
| 9 H | H | Cl | Cl | Vinylidene chloride + alcohol copolymer (vinyl acetate) |
| 10 H | H | H | —Ph | Styrene + vinyl alcohol copolymer (vinyl acetate) |
| 11 H | H | H | H | Ethylene + vinyl alcohol copolymer (vinyl acetate) |

Me: methyl group, Et: ethyl group, iPr: isopropyl group, Bu: butyl group, tBu: tertiary butyl group, Ph: phenyl group, Q: alkyl group Further according to the invention $R^{1'}$ to $R^{4'}$ can be provided by the above combinations.

Furthermore, according to the invention it is possible to provide photoresist compositions, which are excellently transparent and suitable as resist materials for KrF or ArF eximer laser. These compositions have high dry etching resistance compared to the PMMA type resists.

More specifically, these photoresist compositions are copolymers and are thus very highly heat-resistant, and thus they have high dry etching resistance.

These materials release free hydroxyl groups due to acid generated with light of the acid-releasing protective group, and dissolution of the hydroxyl groups in water gives a pattern.

The weight ratio of the composition can be adjusted by the incorporation ratio or the like. If m is too small, it is undesired because dissolution in water can no longer be obtained.

Copolymerization of the vinyl alcohol units with comonomer mainly permits increase of Tg (glass transition point (softening temperature)) over pure polyvinyl alcohol. Tg tends to be reduced when acid-releasing protective groups are introduced into pure polyvinyl alcohol. Tg can increased by increasing the molecular weight. With a positive type material, however, it is unsuitable to increase the molecular weight too much.

These materials can be synthesized by introducing protective group through ester exchanges of a vinyl alcohol type compound as the starting material of vinyl alcohol, such as vinyl acetate, and an acetate body, for instance, obtainable through emulsifying copolymerization of the corresponding vinyl compound, with a compound containing corresponding protective group for the portion of hydroxyl group only.

The ester exchange may be made with $$\text{tBu}-\text{O}-\overset{\overset{\text{O}}{\|}}{\text{C}}-\text{OMe}$$

if the protective group to be introduced is $$\text{tBu}-\text{O}-\overset{\overset{\text{O}}{\|}}{\text{C}}-\text{O}$$

It may be made with

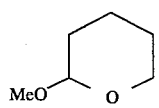

if the protective group is THP.
It may be made with

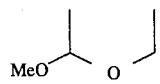

if the protective group is E E (ethyl vinyl ether).

The corresponding acetate body of the material is obtainable by the following method. Vinyl acetate and a vinyl compound are mixed using such an emulsifier as "Noigen YX-500", "Emal-O", etc. The mixture is then polymerized using an aqueous solvent and adding potassium persulfate, ammonium persulfate, etc. and acidic sodium sulfite, sodium sulfonate, sodium phosphate, etc. The polymer is then salted out and then water washed to obtain the acetate body. Such acetate bodies, however, contains alkali metals, and therefore it is preferred to use ammonium bodies.

According to the invention, as the photo acid generator may be used those in Formulas 1 to 13 below.

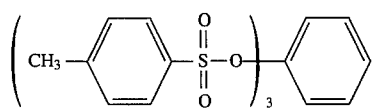  1

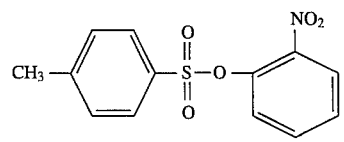  2

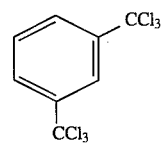  3

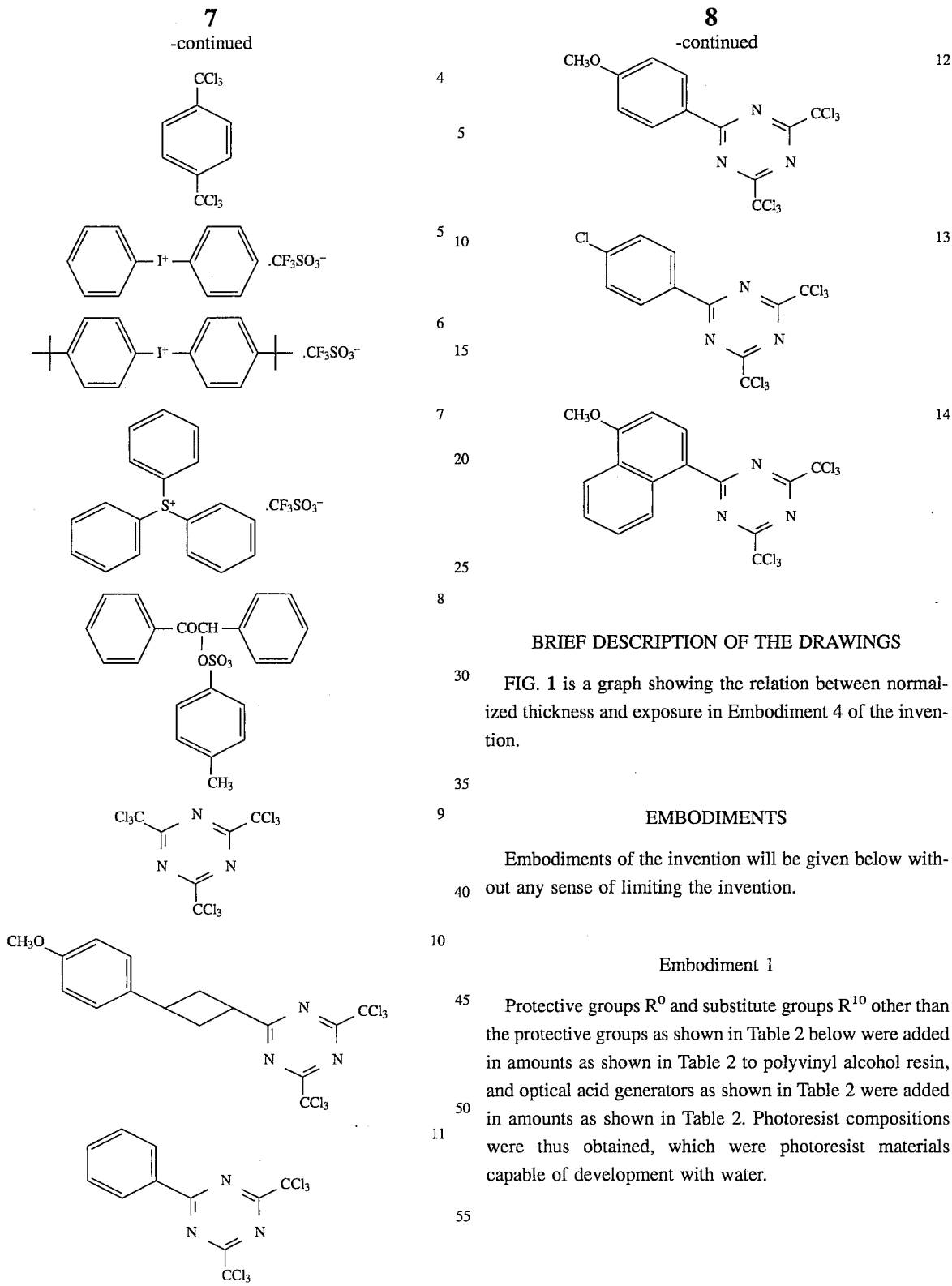

EMBODIMENTS

Figure 1:
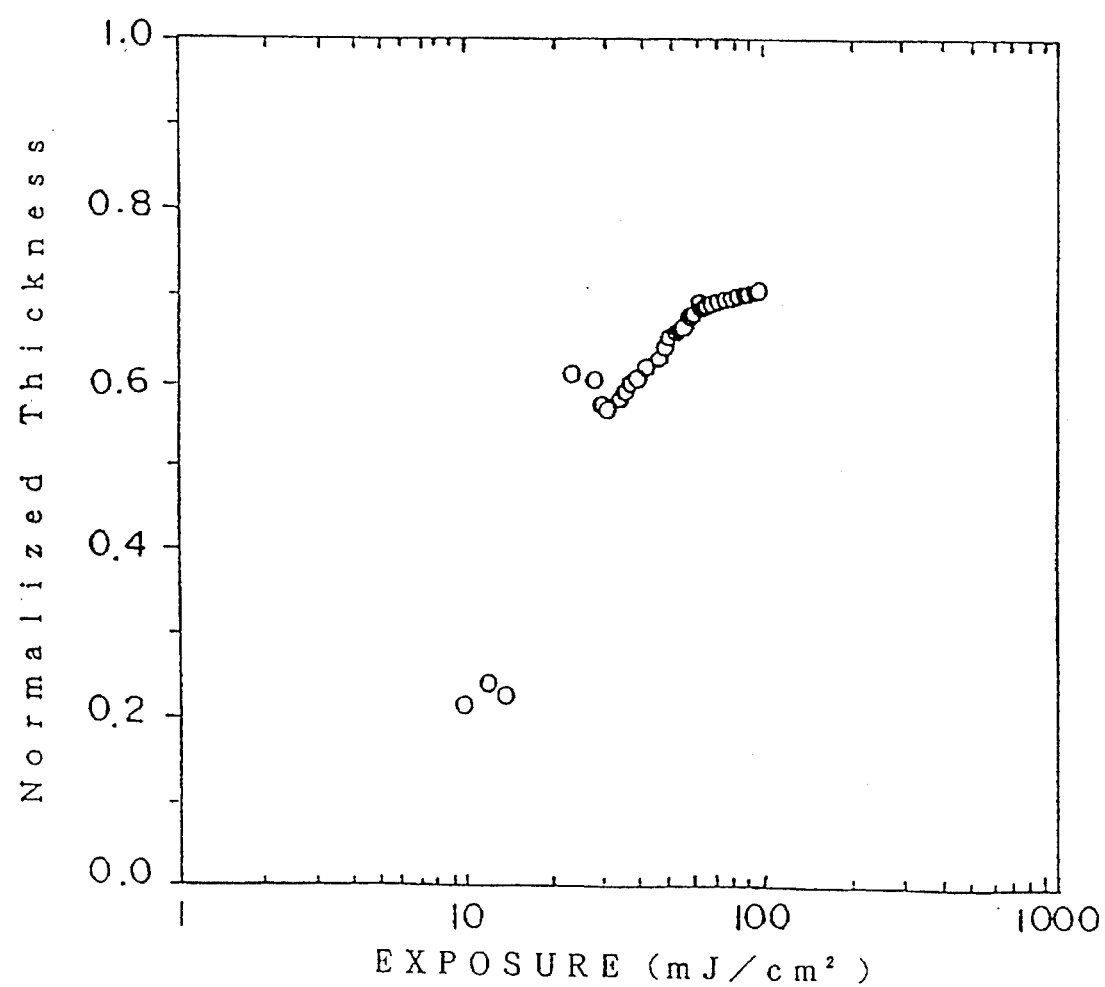
FIG. 1 is a graph showing the relation between normalized thickness and exposure in Embodiment 4 of the invention.

Embodiments of the invention will be given below without any sense of limiting the invention.

Embodiment 1

Protective groups $R^0$ and substitute groups $R^{10}$ other than the protective groups as shown in Table 2 below were added in amounts as shown in Table 2 to polyvinyl alcohol resin, and optical acid generators as shown in Table 2 were added in amounts as shown in Table 2. Photoresist compositions were thus obtained, which were photoresist materials capable of development with water.

TABLE 2

| | Molecular weight | $R^0$ | $R^0$ amount | $R^{10}$ | $R^{10}$ amount | Optical acid generator |
|---|---|---|---|---|---|---|
| A | 10000 | (acetate-O-C(CH3)3) | 40% | (adamantyl) | 40% | Tf$^\oplus$ I$^\ominus$ 3% |
| B | 10000 | (acetate-O-C(CH3)3) | 40% | (cyclohexyl) | 40% | Tf$^\oplus$ I$^\ominus$ 3% |
| C | 10000 | (acetate-O-C(CH3)3) | 40% | (norbornyl) | 40% | Tf$^\oplus$ I$^\ominus$ 3% |
| D | 10000 | (tetrahydropyranyl) | 40% | (adamantyl) | 40% | Tf$^\oplus$ I$^\ominus$ 3% |
| E | 10000 | (acetate-O-C(CH3)3) | 40% | (adamantyl) | 40% | (o-bis(trichloromethyl)benzene) 3% |
| F | 50000 | (acetate-O-C(CH3)3) | 40% | (adamantyl) | 40% | Tf$^\oplus$ I$^\ominus$ 3% |

* Triphenylsulfonium triflate, shown in Formula 7 on page 1.

In this embodiment of the invention, an ArF eximer laser contraction projection exposure apparatus with a contraction factor of 10:1 (manufactured by Raser Ramder Figic) was used, and a 5-inch silicon wafer was used as the pattern formation material.

Each of the resins A to F noted above was dissolved in ethyl cellosolve acetate to produce a coating solution, which was then spin coated on a silicon wafer surface treated with HMDS, followed by baking at 90° C. for 90 seconds to obtain a film with a thickness of 0.7 μm. The film was then exposed using a stepper and by varying the exposure amount and focus using masks with patterns of 0.1 to 0.4 μm line-and-space (with a pitch of 0.02). Then post exposure baking, PEB, was performed at 110° C. for 90. seconds, then paddle development was done with water for 60 seconds, and then rinsing was done with xylene.

Etching was done with an Electrochemical reaction (ECR) etcher by using blend gas of $Cl_2$ and $CCl_4$. Table 3 below shows the threshold resolution and the etching speed. The etching speed is shown in terms of the speed ratio with the etching speed of m-p cresol novolak with a molecular weight of 5,000 as unity speed.

TABLE 3

| | Threshold resolution | Etching speed |
|---|---|---|
| A | 0.19 μm line-and-space | 1.2 |
| B | 0.21 μm line-and-space | 1.6 |
| C | 0.20 μm line-and-space | 1.4 |

TABLE 3-continued

| | Threshold resolution | Etching speed |
|---|---|---|
| D | 0.20 μm line-and-space | 1.2 |
| E | 0.20 μm line-and-space | 1.2 |
| F | 0.25 μm line-and-space | 1.2 |

As shown above, in this embodiment it is possible to provide a photoresist composition, which has satisfactory transparency in the ArF eximer laser range, permits satisfactory pattern shape to be obtained and has high dry etching resistance. Besides, development with water is possible, sanitary sewage treatment of organic alkali is unnecessary. It is thus possible to provide a resist material, which is advantageous in view of the environmental safeguarding and can be said to be "kind to the earth".

Embodiment 2

In this embodiment, the compositions No. 1 to No. 11 shown in Table 1 noted above were used. The polymerization of the copolymer was set to 1:1. The same exposure material as in Embodiment 1 was used. As the development, paddle development was done with water for 60 seconds. As the baking conditions, pre-baking was done at 100° C. for 100 seconds, PEB was done at 110° C. for 90 seconds, and afterbaking was done at 150° C. for 120 seconds. As the solvent, ECA (ethyl cellosolve acetate) was used.

The exposure was done in two ways, when using KrF eximer stepper and when using ArF eximer stepper.

Table 4 below shows the results.

TABLE 4

| | Protective group: t-BOC | | | | Protective group: THP | | | | Protective group: for t-Bu $t\text{-Bu}-C\overset{\displaystyle O}{\underset{\displaystyle O}{\diagup}}$ | | | |
|---|---|---|---|---|---|---|---|---|---|---|---|---|
| | KrF | | ArF | | KrF | | ArF | | KrF | | ArF | |
| composition No. | Sensitivity | Min. pattern (μm) | Sensitivity | Min. pattern (μm) | Sensitivity | Min. pattern (μm) | Sensitivity | Min. pattern (μm) | Sensitivity | Min. pattern (μm) | Sensitivity | Min. pattern (μm) |
| 1 | 30 | 0.30 | 40 | 0.22 | 30 | 0.30 | 32 | 0.25 | 70 | 0.33 | 80 | 0.29 |
| 2 | 35 | 0.28 | 50 | 0.20 | 25 | 0.30 | 42 | 0.27 | 78 | 0.32 | 88 | 0.30 |
| 3 | 20 | 0.30 | 30 | 0.38 | 18 | 0.32 | 32 | 0.27 | 82 | 0.38 | 89 | 0.36 |
| 4 | 20 | 0.30 | 32 | 0.25 | 18 | 0.30 | 27 | 0.28 | 80 | 0.34 | 93 | 0.32 |
| 5 | 20 | 0.30 | 33 | 0.25 | 18 | 0.31 | 27 | 0.29 | 81 | 0.34 | 74 | 0.33 |
| 6 | 40 | 0.25 | 48 | 0.18 | 30 | 0.28 | 36 | 0.24 | 95 | 0.32 | 115 | 0.28 |
| 7 | 35 | 0.27 | 40 | 0.19 | 31 | 0.28 | 32 | 0.23 | 92 | 0.32 | 135 | 0.32 |
| 8 | 30 | 0.30 | 42 | 0.20 | 21 | 0.30 | 33 | 0.25 | 67 | 0.35 | 170 | 0.25 |
| 9 | 30 | 0.30 | 45 | 0.25 | 20 | 0.30 | 37 | 0.30 | 60 | 0.38 | 90 | 0.30 |
| 10 | 30 | 0.40 | 70 | 0.30 | 70 | 0.40 | 95 | 0.40 | 135 | 0.45 | 160 | 0.40 |
| 11 | 30 | 0.28 | 35 | 0.22 | 25 | 0.30 | 32 | 0.30 | 70 | 0.30 | 100 | 0.28 |

As has been shown, in this embodiment it is possible to provide a photoresists capable of development with water kind to environment and having excellent dry etching resistance, high Tg and high permeability to the Ar eximer laser beam (193 nm) and KrF eximer laser beam (248 nm).

Embodiment 3

In this embodiment, butyral resin (1) shown below was used as the substance containing a skeleton as at least a part of a main chain, the skeleton being obtained through polymerization of a vinyl alcohol type compound, at least some hydroxyl groups in the skeleton being protected by acid-releasing protective group. Particularly, the butyral resin used had an acetylation factor of 70 mol % or above.

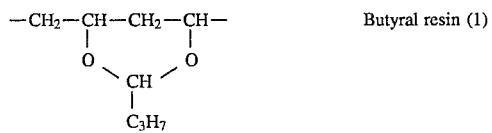

Butyral resin (1)

As the optical acid generator was used the exemplified compound 7 noted above (i.e., triphenylsulfonium triflate).

In this embodiment, 0.18 g of the above optical acid generator is dissolved in ECA (ethyl cellosolve acetate) to obtain 13.08 g of solution. 1.07 g of the above butyral resin (1) was dissolved in this solution, and the resultant solution was passed through a 0.2μm membrane filter and then spin coated on a Si wafer.

The film thus obtained was pre-heated at 90° C. for 90 seconds. Then, it was exposed to KrF eximer laser beam (or ArF eximer laser beam), and then PEB (post-exposure baking) was done at 80° C. for 90 seconds, followed by development with hot water at 80° C. for several minutes, thus obtaining a satisfactory positive pattern.

The development is done with hot water in order to obtain satisfactory dissolution of the exposed portion if some released groups remained. (see Ichiro Sakurada, Osamu Yoshizaki "Polymer Chemistry" 10,306,310, 1953).

Embodiment 4

The butyral resin (2) used in Embodiment 3 permits a negative pattern to be obtained by development with alcohol.

In this embodiment, the same exemplified compound (triphenylsulfonium triflate) as in Embodiment 3 was used as the optical acid generator. 0.18 g of this optical acid generator was dissolved in ECA (ethyl cellosolve acetate) to obtain 13.08 g of solution. 1.07 g of butyral resin (1) noted above was then dissolved in 1.07 g of the solution, and the resultant solution was passed through a 0.2μm membrane filter and then spin coated on a Si wafer.

The film thus obtained was pre-baked at 90° C. for 90 seconds. Then, it was exposed as in Embodiment 3, then PEB (post-exposure baking) was done at 110° C. for 90 seconds, followed by development with ethanol for 2 minutes. Thus, satisfactory negative pattern could be obtained. FIG. 1 shows the characteristic (i.e., relation between normalized thickness and exposure). The photoresist composition used in Embodiments 3 and 4 can be said to be suitable for fine processes with KrF or ArF eximer laser beam.

According to the invention, it is possible to provide a new photoresist composition, which is suited for fine processes and can be actually utilized in various dry etching processes. Also, it is possible to provide a method of forming a pattern using such a photoresist composition.

What is claimed is:

1. A method of forming a pattern on an exposure material comprising the steps of:
   providing a silicon wafer substrate;
   providing a photoresist composition comprising:
   (a) a copolymer derived from:

(i)

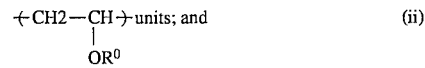

(ii)

-continued

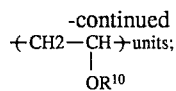 (iii)

alone or in combination with at least one comonomer selected from:

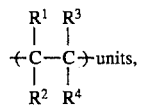 (iv)

wherein $R^0$ is selected from

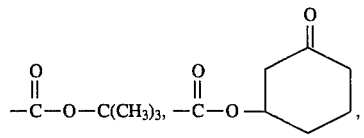

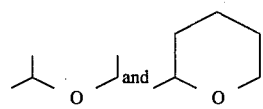

groups $R^{10}$ is selected from adamantyl, norbonyl, cyclohexyl, cyclopentyl and t-butyl groups; $R^1$, $R^2$, $R^3$ and $R^4$ are selected from hydrogen, halogen, alkyl, chloromethyl, allyl,

—COQ, —OAc and —CN groups, wherein Q is alkyl or cycloalkyl, and Ac is acetate; and (b) a photoacid generator, said composition being developable in a polar solution and exhibiting good dry etching resistance;

spin coating a surface of the wafer with said photoresist composition to provide a coated substrate;

exposing the coated substrate through a mask with a KrF or ArF excimer laser radiation to provide an exposed substrate;

baking the exposed substrate; and developing the baked and exposed substrate with a developing solution to provide a pattern on the substrate.

2. A method of forming a pattern as defined in claim 1, further comprising, after the developing step, rinsing the substrate with a low polarity solution.

3. A method as defined in claim 1, wherein the developing solution is an alcohol and the pattern provided is a negative pattern.

4. A method as defined in claim 1, wherein the developing solution is an aqueous solution.

5. A method as defined in claim 1, wherein the pattern provided is a positive pattern.

* * * * *